(12) United States Patent
Currey

(10) Patent No.: US 12,208,418 B2
(45) Date of Patent: Jan. 28, 2025

(54) MANIFOLD FOR A HYDRAULIC VIBRATION GENERATING DEVICE OR HYDRAULIC MOTOR

(71) Applicant: Albert Ben Currey, Phoenix, AZ (US)

(72) Inventor: Albert Ben Currey, Phoenix, AZ (US)

( * ) Notice: Subject to any disclaimer, the term of this patent is extended or adjusted under 35 U.S.C. 154(b) by 0 days.

(21) Appl. No.: 18/519,318

(22) Filed: Nov. 27, 2023

(65) Prior Publication Data

US 2024/0307920 A1    Sep. 19, 2024

Related U.S. Application Data

(62) Division of application No. 18/184,161, filed on Mar. 15, 2023, now Pat. No. 11,826,782.

(51) Int. Cl.
| | |
|---|---|
| *B06B 1/18* | (2006.01) |
| *B01F 31/00* | (2022.01) |
| *B01F 35/32* | (2022.01) |
| *F15B 11/08* | (2006.01) |
| *F15B 15/20* | (2006.01) |

(52) U.S. Cl.
CPC ............ *B06B 1/186* (2013.01); *B01F 31/70* (2022.01); *B01F 35/32045* (2022.01); *F15B 11/08* (2013.01); *F15B 15/20* (2013.01)

(58) Field of Classification Search
CPC .... B06B 1/186; B01F 31/70; B01F 35/32045; F15B 11/08; F15B 15/20
USPC ................................................. 366/124–126
See application file for complete search history.

(56) References Cited

U.S. PATENT DOCUMENTS

| | | | | |
|---|---|---|---|---|
| 2,215,888 A | * | 9/1940 | Swarthout | E04G 21/08 404/115 |
| 2,970,570 A | * | 2/1961 | Hill | B06B 1/183 366/124 |
| 3,235,230 A | * | 2/1966 | Malan | B06B 1/186 366/125 |
| 3,292,835 A | * | 12/1966 | Wolf | F16H 27/00 226/162 |
| 3,528,646 A | | 9/1970 | Best | |
| 3,866,480 A | | 2/1975 | Elliston | |

(Continued)

FOREIGN PATENT DOCUMENTS

DE        29922369 U1 *  3/2000  ............. B06B 1/186

*Primary Examiner* — Charles Cooley
(74) *Attorney, Agent, or Firm* — Schmeiser, Olsen & Watts LLP

(57) ABSTRACT

A hydraulic vibration generation device or hydraulic motor is provided. The device includes a manifold having an inner volume with a pressure chamber extending into the inner volume, a fluid inlet orifice and a fluid outlet orifice. The device further includes a vibration generating member having a grooved drive and an off-center weight and retaining plates. The inner volume receives the vibration generating member within the inner volume. The vibration generating member rotates and generates vibration in response to hydraulic fluid flowing into the manifold through the inlet orifice and directed through the pressure chamber, relieves pressure upon exiting the pressure chamber and out of the manifold through the outlet orifice. Also provided a hydraulic motor with a same manifold and pressure chamber, but with a power generating member having the same groove drive without and off-center weight. Rotation of the power generating member generates power.

5 Claims, 10 Drawing Sheets

(56) References Cited

U.S. PATENT DOCUMENTS

| | | | | |
|---|---|---|---|---|
| 4,039,167 | A * | 8/1977 | Zinga | B06B 1/16 366/125 |
| 4,057,222 | A * | 11/1977 | Lyle | F03C 2/08 418/171 |
| 4,472,980 | A | 9/1984 | Wadensten | |
| 4,590,814 | A | 5/1986 | Wadensten | |
| 4,604,029 | A * | 8/1986 | Fink | B06B 1/186 415/92 |
| 5,314,305 | A * | 5/1994 | Fink | B06B 1/186 415/214.1 |
| 6,244,815 | B1 * | 6/2001 | Treat | F01D 1/02 366/124 |
| 6,261,059 | B1 * | 7/2001 | Wadensten | F01D 1/026 415/198.1 |
| 10,610,896 | B1 * | 4/2020 | Currey | B06B 1/186 |
| 10,987,698 | B2 * | 4/2021 | Currey | B06B 1/186 |
| 11,773,556 | B2 * | 10/2023 | Currey | B06B 1/183 405/117 |
| 11,826,782 | B1 * | 11/2023 | Currey | F15B 11/08 |
| 2001/0004438 | A1 * | 6/2001 | Reis | B06B 1/186 366/124 |
| 2012/0063260 | A1 * | 3/2012 | Tsai | B06B 1/186 366/124 |
| 2018/0292501 | A1 * | 10/2018 | Neumann | B06B 1/186 |
| 2021/0060615 | A1 * | 3/2021 | Currey | B06B 1/186 |
| 2021/0205847 | A1 * | 7/2021 | Currey | B06B 1/186 |
| 2021/0370349 | A1 * | 12/2021 | Currey | F03B 1/02 |
| 2024/0307920 | A1 * | 9/2024 | Currey | B06B 1/186 |
| 2024/0309895 | A1 * | 9/2024 | Currey | B06B 1/186 |

* cited by examiner

MANIFOLD FOR A HYDRAULIC VIBRATION GENERATING DEVICE OR HYDRAULIC MOTOR

CROSS REFERENCE TO RELATED APPLICATION[S]

This application is a divisional of U.S. patent application Ser. No. 18/184,161, filed Mar. 15, 2023, the disclosure of which is hereby incorporated entirely herein by reference.

BACKGROUND OF THE INVENTION

Technical Field

This invention relates generally to a vibration generating device or hydraulic motor, and more particularly to a manifold for use with a vibration generating device or hydraulic motor.

State of the Art

There are several material processing products that utilize vibration during operation, such as, but not limited to screening of material implementations. Other devices also utilize vibratory devices in the operation and utilization. These devices are generally electromechanical or mechanical system. They include gears and other components that are prone to failure.

Further, there are also several material processing products as well as other types of products that utilize motors. These motors are generally electromechanical systems that operate by drawing power from a power source to drive an external component. There are limitations, including limitations on the access to or supply of power from power sources and components that are prone to failure.

Therefore, there is a need for an improved manifold for use with a hydraulic vibration generating device or a hydraulic motor.

SUMMARY OF THE INVENTION

The present invention relates to a hydraulic vibration generation device comprising: a manifold comprising a fluid inlet orifice; a fluid outlet orifice; and an inner volume, wherein the inner volume is defined by a cylindrical surface with a diameter; a vibration generating member coupled within the inner volume of the manifold, wherein the vibration generating member is a shaft having a diameter that is smaller than the diameter of the cylindrical surface of the manifold forming a gap between the cylindrical surface and the vibration generating member, wherein the vibration generating member further comprises: a grooved drive comprising a plurality of recessed grooves formed in an outer surface of the vibration generating member, wherein the recessed grooves of the plurality of recessed grooves are evenly spaced around the circumference of the vibration generating member; and a pressure chamber formed in the manifold, the pressure chamber comprising: a protrusion extending from the cylindrical surface with the inlet orifice extends through the protrusion into the inner volume; a pressure channel formed in the protrusion, the pressure channel overlapping the inlet orifice and extends along a length of the protrusion below the inlet orifice; and a seal portion above the inlet orifice and on either side of the pressure channel, wherein the pressure chamber is defined by the channel on four sides, the grooved drive on a fifth side with an exit located at a lower end of the channel, wherein: the inner volume receives the vibration generating member within the inner volume locating the grooved drive adjacent the pressure channel such flow of hydraulic oil is inhibited between the vibration generating member and the seal portion; and the vibration generating member rotates and generates vibration in response to hydraulic oil flowing into the pressure chamber of the manifold through the inlet orifice, through the pressure chamber engaging the grooved drive to rotate the vibration generating member, out of the pressure chamber and pressure is relieved as the hydraulic oil flows into the gap, and out of the inner volume through the outlet orifice.

The foregoing and other features and advantages of the present invention will be apparent from the following more detailed description of the particular embodiments of the invention, as illustrated in the accompanying drawings.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF EMBODIMENTS OF THE INVENTION

Figure 1:
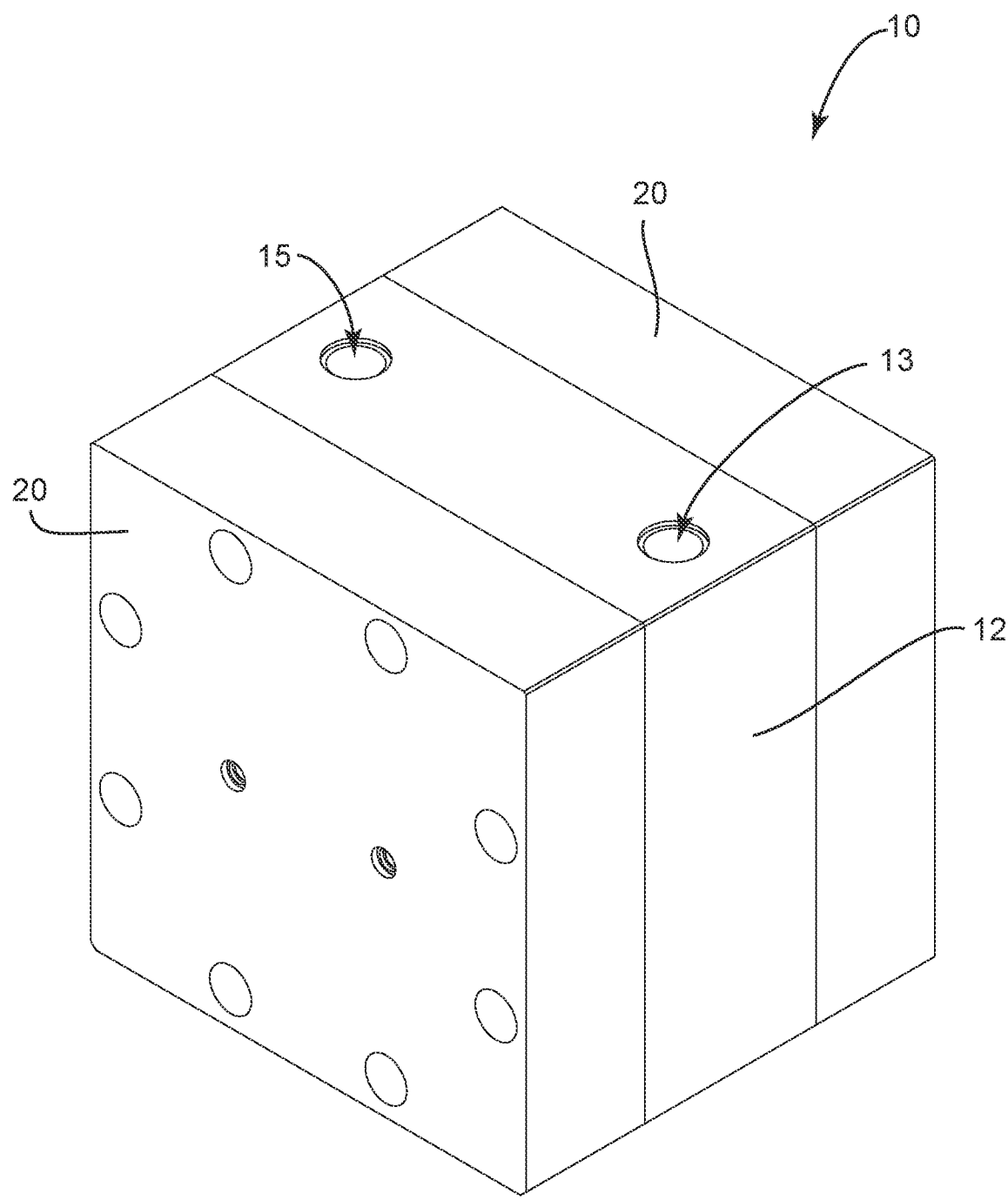
FIG. 1 is a perspective view of a hydraulic vibration generating device according to an embodiment.
Figure 2:
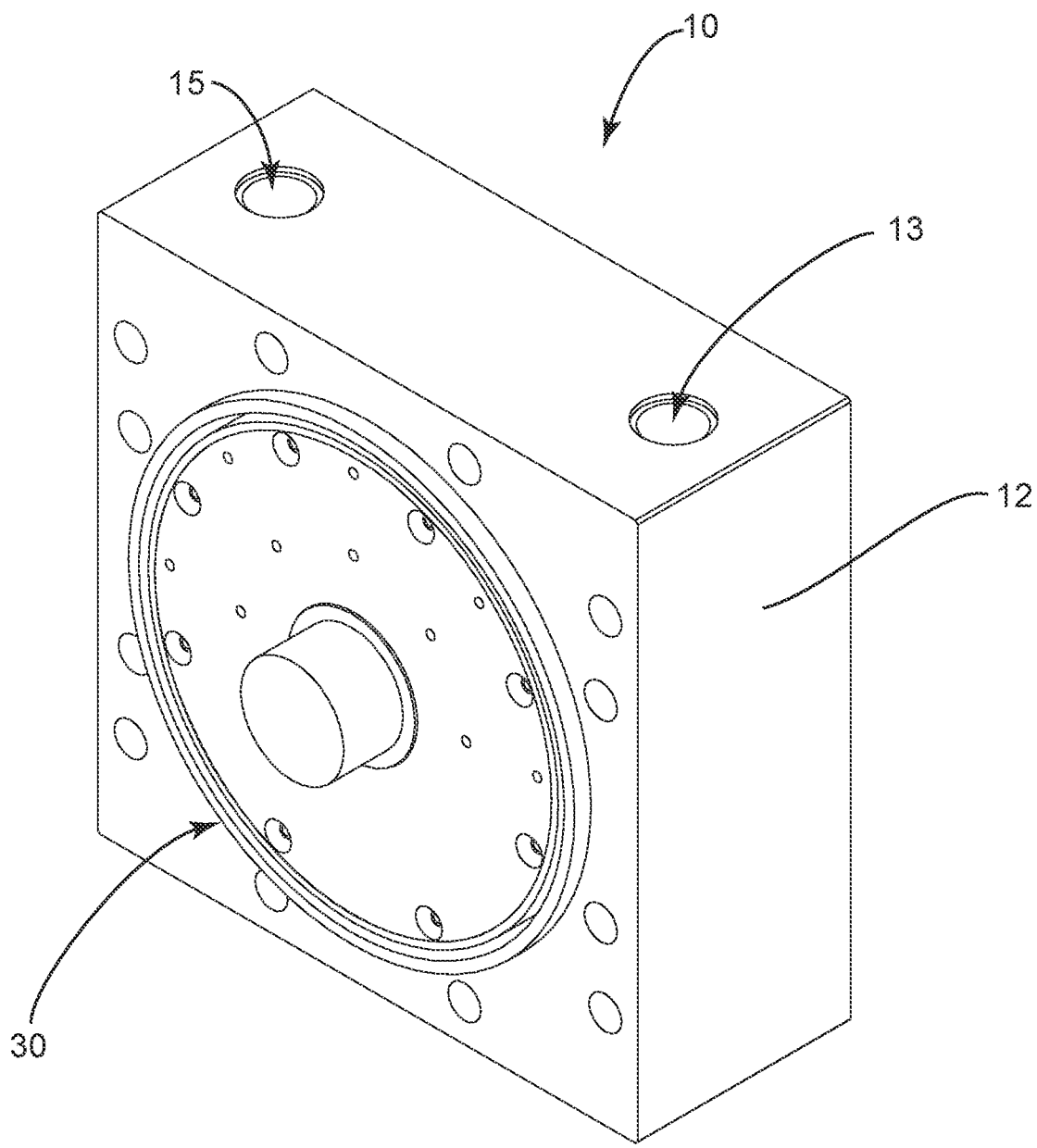
FIG. 2 is a perspective view of a manifold and a vibration generating member of a hydraulic vibration generating device according to an embodiment.

As discussed above, embodiments of the present invention relate to a hydraulic driven vibration generating device.

Referring to the drawings, FIGS. 1-7B depict an embodiment of a hydraulic driven vibration generating device 10. The device 10 generally comprises a manifold 12, retaining plates 20, and a vibration generating member 30, wherein the vibration generating member 30 is retained within the manifold 12 by coupling the retaining plates 20 to the manifold 12.

The manifold 12 may be a block shape or other shape that is needed for the operation of the vibration generating device 10. The manifold 12 may comprise an inner volume 14 that may be defined by a cylindrical surface 11 with a diameter forming an aperture extending through the manifold 12, wherein the aperture may be bounded on each end by coupling the retaining plates 20 on opposing side of the manifold 12. The manifold 12 may also comprise an inlet orifice 13 and an outlet orifice 15. This allows hydraulic fluid to flow into the manifold 12 through the inlet orifice 13 and into the inner volume 14 to engage and rotate the vibration generating member 30, and then out through the outlet orifice 15. The outlet orifice 15 has a larger opening to the inner volume 14 than the inlet orifice 13 in order to remove fluid from the inner volume as quickly as possible. An inlet hose adapter (not shown) may be coupled between the inlet orifice 13 and an inlet hose and an outlet hose adapter (not shown) may be coupled between the outlet orifice 15 and an outlet hose, thereby allowing a fluid inlet hose and a fluid outlet hose to be coupled to the manifold 12 for operation of the device 10. The inlet orifice 13 and the outlet orifice 15 may be at any angle through the manifold 12 to accomplish the flow of hydraulic oil into and out of the manifold 12.

In further embodiments, the inlet orifice 13 may comprise a reduce diameter portion 17 extends between the inlet orifice 13 the inner volume 14 of the manifold 12. This reduction of diameter may operate to increase the pressure of the hydraulic fluid engaging the vibration generating member 30.

Figure 7A:
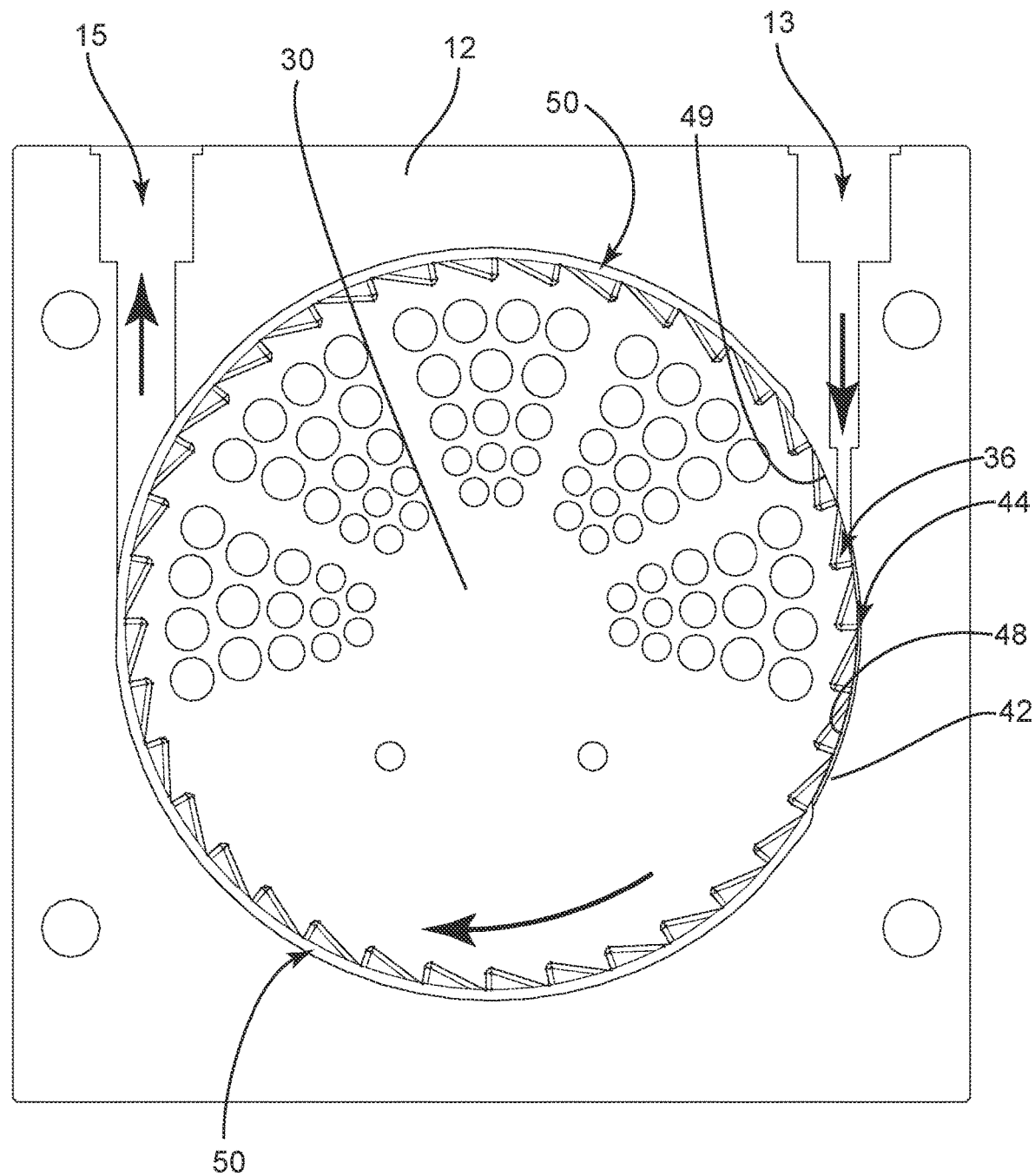
FIG. 7A is a section view of a manifold for use with a hydraulic vibration generating device according to an embodiment.

The vibration generating member 30, formed as a spool, may comprise a shaft 34 having voids 32 formed or cut into a portion or portions of the shaft 34. These voids 32 may be covered by cover plates 35 that are coupled on opposing side of the vibration generating member 30. The voids 32 reduce weight on one side of the shaft 34 thereby creating a weighted side of the shaft 34, wherein the center of gravity is offset from the axis and is located toward the weighted side of the shaft 34 and not on the axis of the shaft, thereby making the weight "off-center". The shaft 34 of the vibration generating member 30 is rotatable within the inner volume 14 of the manifold 12. The rotation of the shaft 34 with the off-center weight or offset center of gravity results in vibration of the manifold 12. As shown in FIG. 7A, the diameter of the shaft 34 is smaller than the diameter of the inner volume 14 of the forming a gap 50 between the vibration generating member 30 and the inner volume 14.

The vibration generating member 30, formed as a spool, comprises a grooved drive 36 formed in the outer surface of the shaft 34 around a circumference of the shaft 34. The grooved drive 36 comprises a plurality of grooves 38 formed in the outer surface of the shaft 34 and are evenly spaced around the circumference of the shaft 34, such that hydraulic fluid may engage the grooves 38 to rotate the shaft 34.

The manifold 12 comprises a pressure chamber 40. The pressure chamber 40 may comprise a protrusion 42 extending into the inner volume 14 from the cylindrical surface 11 of the inner volume 14. The protrusion 42 may be curved and may have a thickness that is slightly smaller than the gap 50. The inlet orifice 13 may extend through the protrusion of the pressure chamber 40. The pressure chamber 40 may further comprise a pressure channel 44 formed in the protrusion 42. An upper end 43 of the pressure channel 44 is located in a position that overlaps the inlet orifice 13 between the lower end 17 and the upper end 19 of the inlet orifice 13 without extending past the upper end 19. The pressure channel 44 then extends past the lower end 17 until the end of the protrusion 42 forming a lower end 45 of the pressure channel 44. The pressure channel 44 forms side walls 48 and the length of the side walls 48 may be equal along the length of the pressure channel 44.

A portion of the protrusion extends above the upper end 19 of the inlet orifice 13, wherein the portion that extends above the upper end 19 of the inlet orifice and portions of the protrusion 42 on either side of the pressure channel 44 form a seal portion 49. The seal portion 49 does not include the pressure channel 44 and operates to form a space between the seal portion 49 and the shaft 34 that is small enough to inhibit hydraulic oil from traveling up and around the shaft 34 in a direction opposite of the direction of rotation of the shaft 34. In at least this way, the thickness of the protrusion is slightly smaller than the gap 50. This results in reduction of pressure in a direction opposing the direction of rotation of the shaft 34 and allows the shaft 34 to rotate in the proper direction more easily than if the seal portion 49 did not exist. The pressure channel 44 and seal portion 49 forms the pressure chamber 40 between the groove drive 36 of the shaft 34 and the pressure channel 44, thereby ensuring that the pressure being produced by pumping of hydraulic oil into the inlet orifice 13 is located within the space bound on four sides by the pressure channel 44 and on a fifth side by the groove drive 36 of the shaft 34, with only one exit from the hydraulic oil, the exit located at the lower end 45 of the pressure channel 44. Upon exiting the pressure chamber 44, the hydraulic oil may be dispersed into the gap 50 and flow out of the manifold 12 through the outlet orifice. This pressure chamber 40 operates to reduce pressure acting on the shaft 34 in a direction opposite the direction of rotation, thereby adding efficiency and increased performance of the vibration generating member 30.

Without the pressure chamber 40, the block pressure fights against the rotation of the shaft 34 and prevents the shaft 34 from rotating, particularly when the system and hydraulic oil is cold. With the pressure chamber 40, the block pressure is reduced the essentially all of the reduction of block pressure is recovered in the pressure chamber 40 and directed in the path of least resistance through the pressure channel 44 to engage the grooved drive 36 of the shaft 34.

Figure 4:
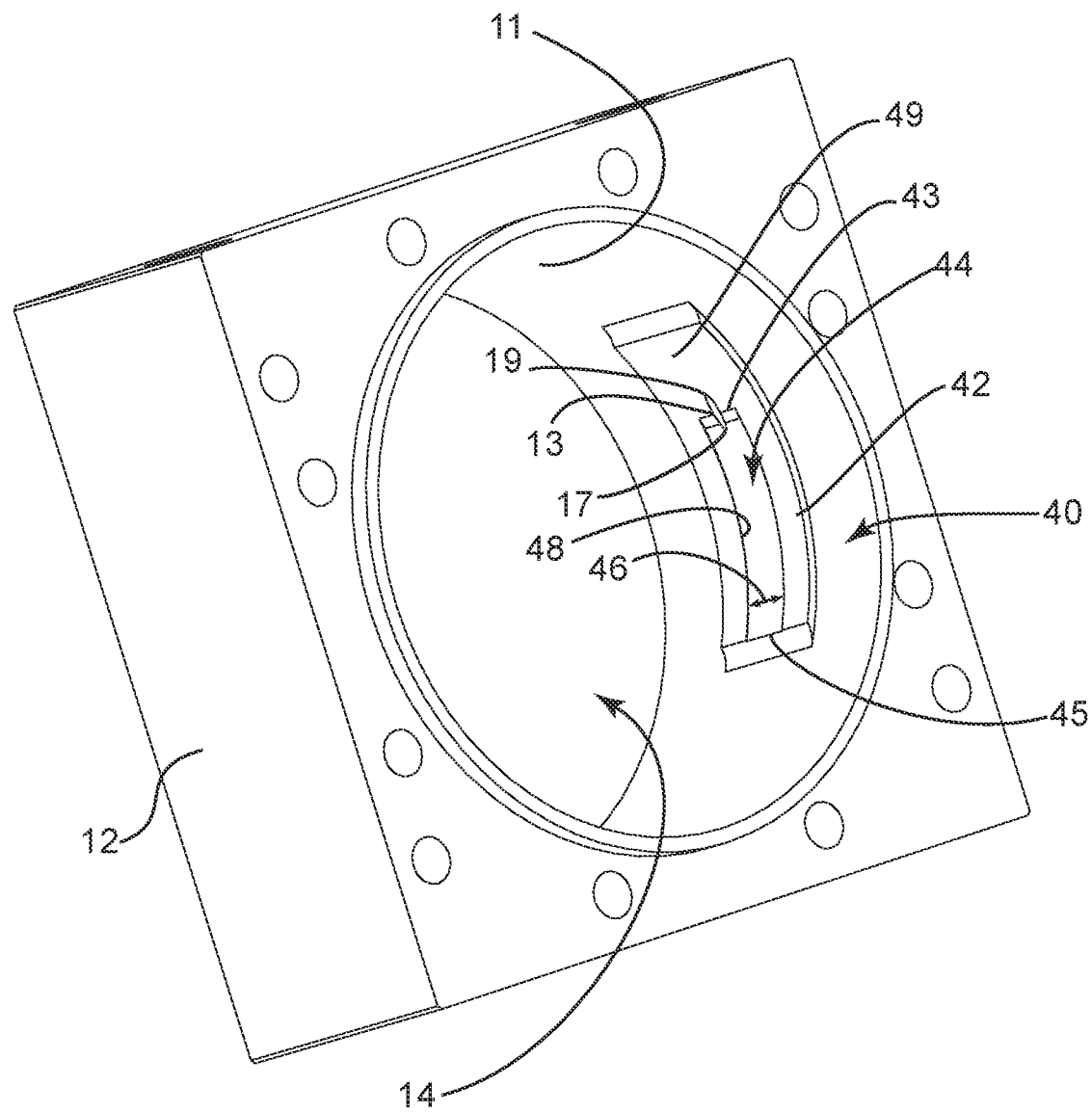
FIG. 4 is a perspective view of a manifold for use with a hydraulic vibration generating device according to an embodiment.
Figure 5:
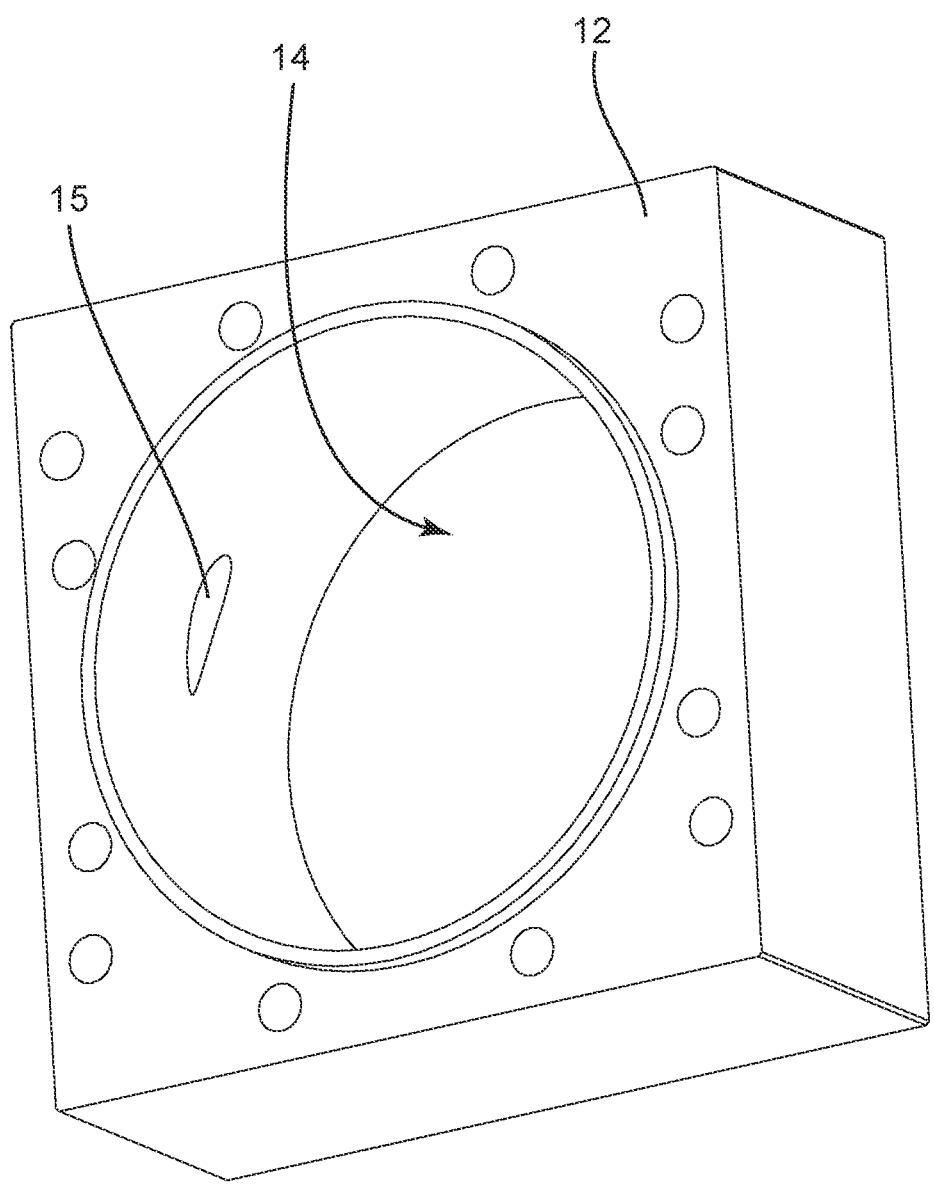
FIG. 5 is a perspective view of a manifold for use with a hydraulic vibration generating device according to an embodiment.
Figure 6A:
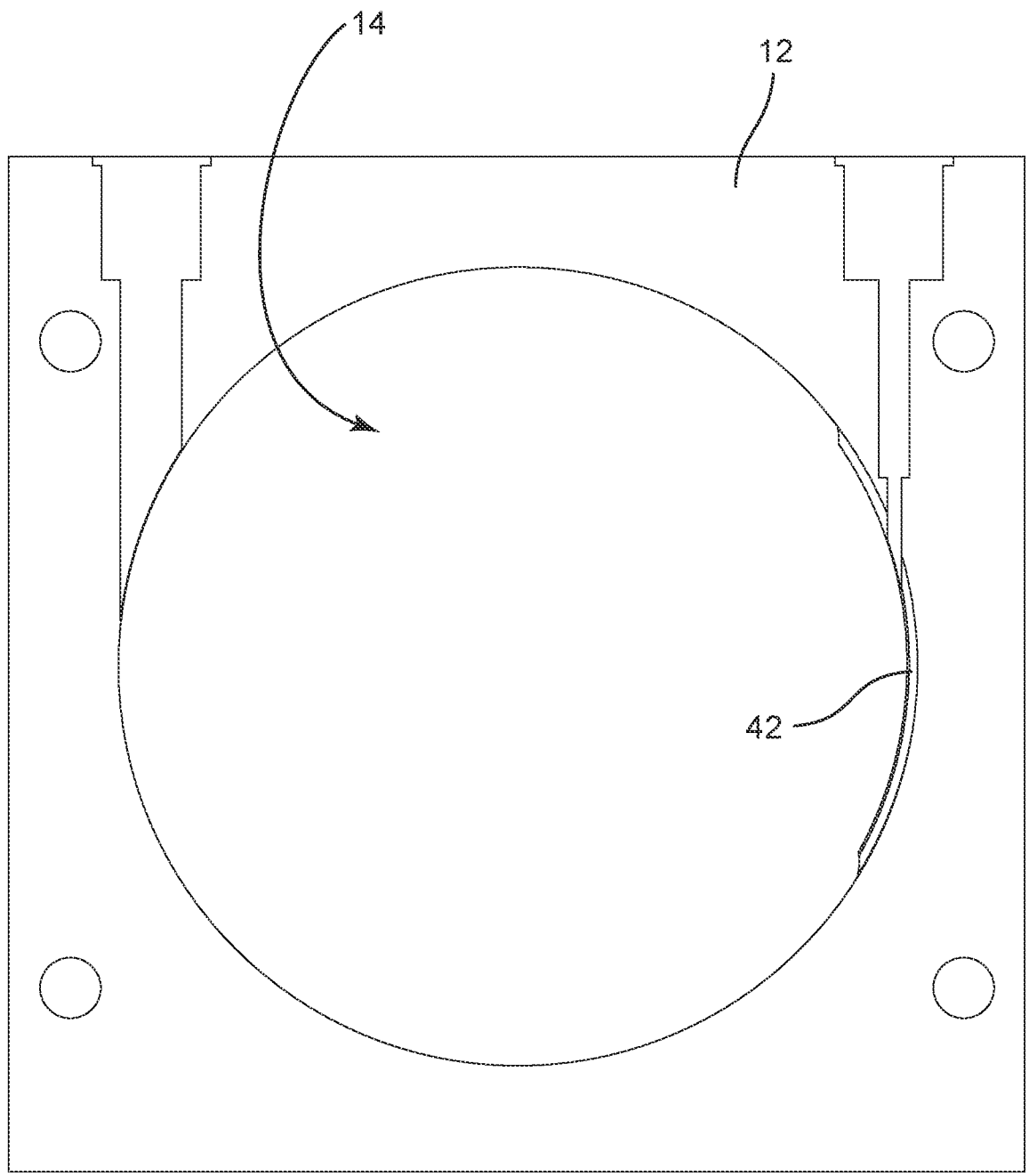
FIG. 6A is a side view of a manifold for use with a hydraulic vibration generating device according to an embodiment.
Figure 6B:
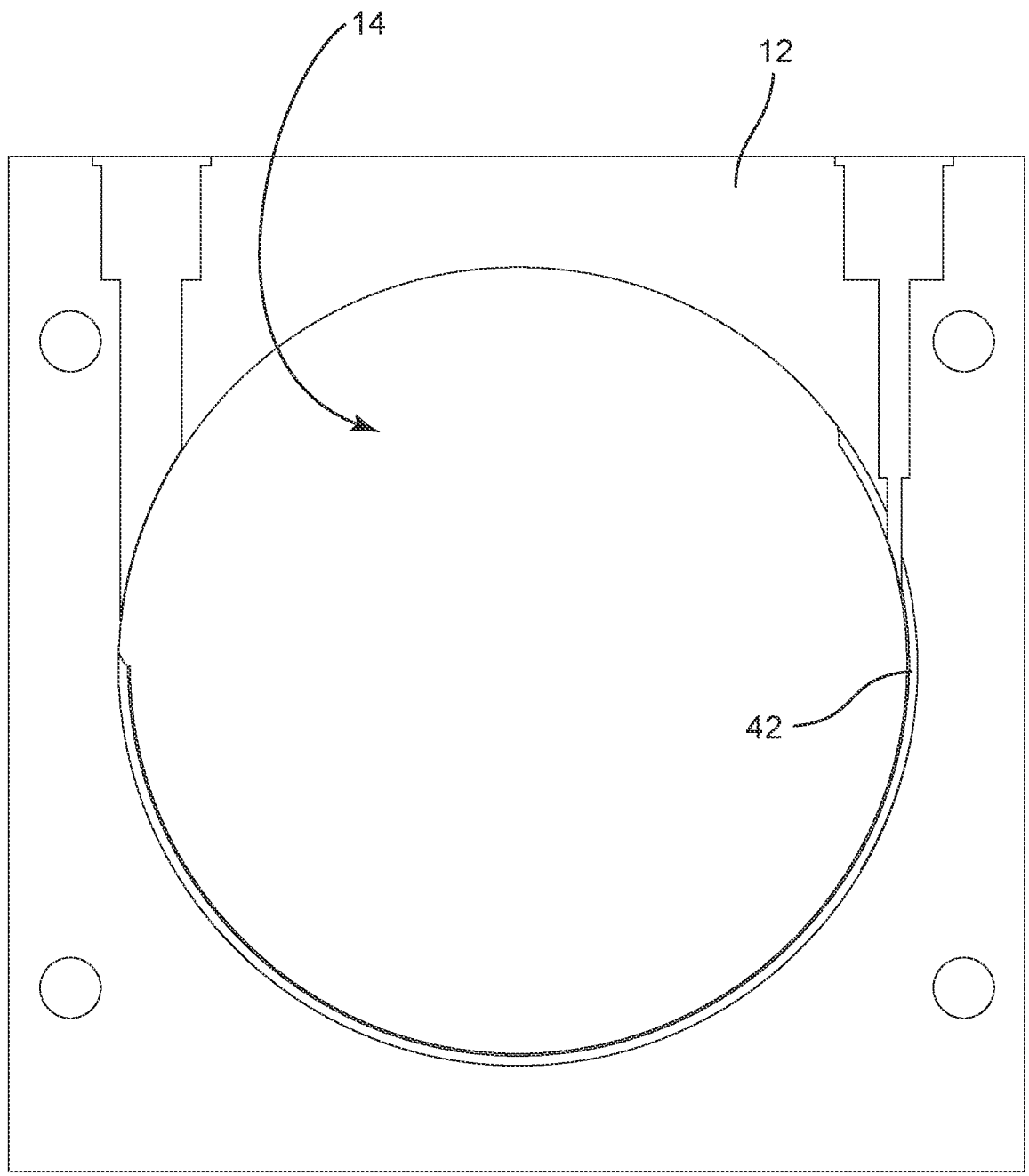
FIG. 6B is a side view of a manifold for use with a hydraulic vibration generating device according to an embodiment.

The length of the protrusion 42 may have varying lengths. In embodiments, the scaling portion 49 of the protrusion extending above the upper end 19 of the inlet orifice 13 may be at least as long as the length of the at least one groove 38 and the length of the protrusion extend below the lower end 17 of the inlet orifice may be at least as long as at least two grooves 38, as shown in FIGS. 4, 6A and 7. However, various lengths of protrusions 42 may be utilized, such as shown in FIG. 6B, and the length may extend between the inlet orifice 13 and the outlet orifice 15 in the direction of rotation. Additionally, in embodiments, a width 46 of the pressure channel 44 may be equal to or less than a width 37 of the grooves 38 of the groove drive 36 of the shaft 34.

In operation, hydraulic oil is flowed into the inlet orifice 13 and engages the grooves 38 of the groove drive 36 of the shaft 34 of the vibration generating member 30. The hydraulic oil engages the grooves 38 within the pressure chamber, wherein the pressure of the hydraulic oil, because of the small pace between the groove rive 36 and the pressure channel 44, is higher than the pressure within the gap 50 and operates to rotate the vibration generating member 30 in a direction of rotation toward the outlet orifice 15. As the hydraulic oil travels through the pressure channel 44 rotating the shaft 34, the hydraulic oil exits the pressure chamber 40 as the lower end 45 of the pressure channel 44 and the pressure is relieved into the gap and the hydraulic oil can then exit the inner volume 14 of the manifold 12 through the outlet orifice 15. The rotation of the vibration generating device 13 creates vibration that can be utilized in various applications.

The manifold 12 may have various apertures and recesses that are utilized to couple the retaining plate 20 to the manifold and for use of couplers to couple the manifold 12 to an external device to vibrate. While these apertures and recesses are shown, they are only for exemplary purposes and should not be considered a limitation, but simply as one way that certain components of a hydraulic vibration generating device 10 may be coupled together. Other forms of coupling components together are contemplated and may be used without departing from the scope of the invention and claims. Further, the manifold 12 is depicted as a unitary body member. It will be understood that the manifold 12 may comprise at least two portions that may be coupled together to form the manifold 12.

Figure 3A:
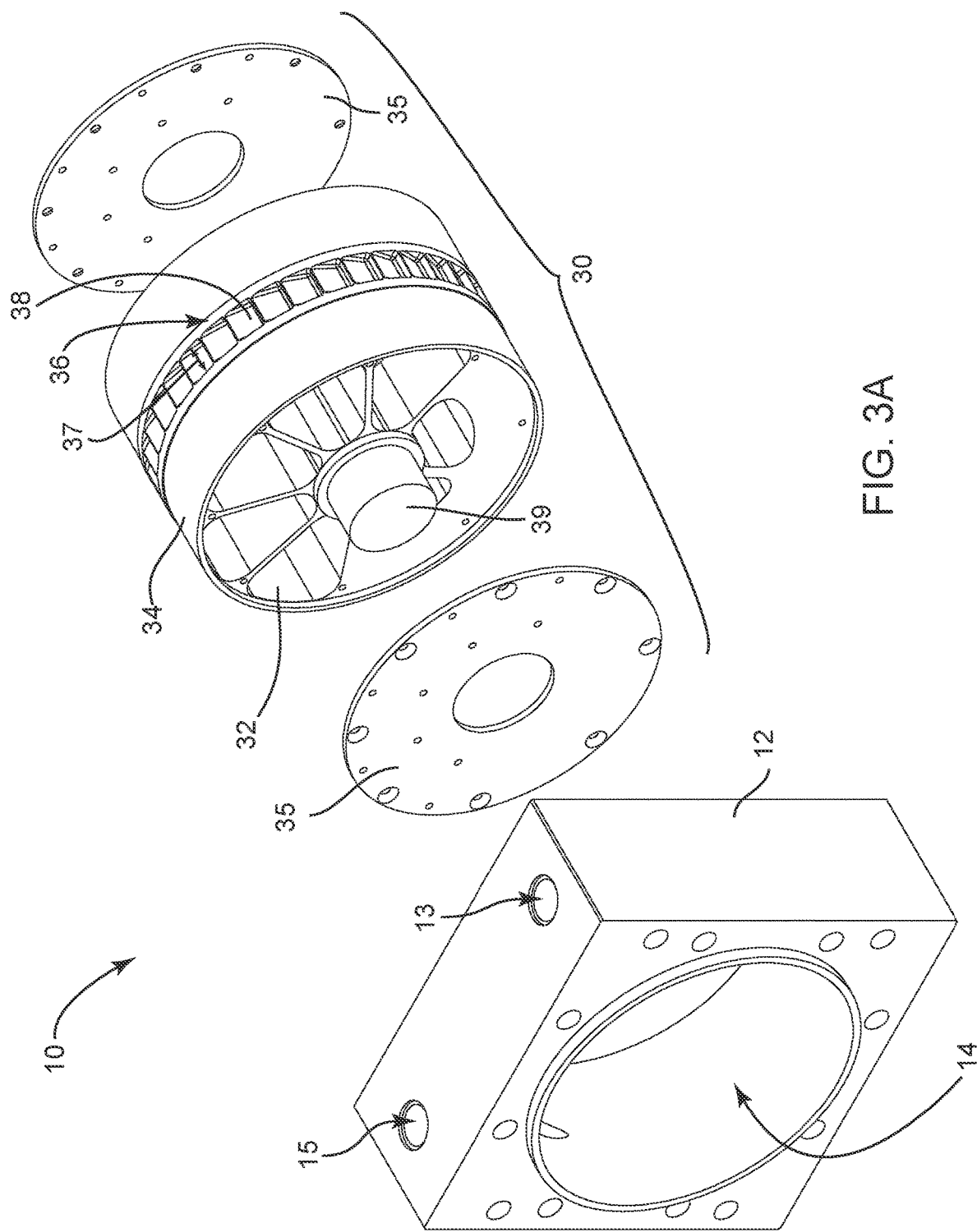
FIG. 3A is a perspective exploded view of a hydraulic vibration generating device according to an embodiment.
Figure 3B:
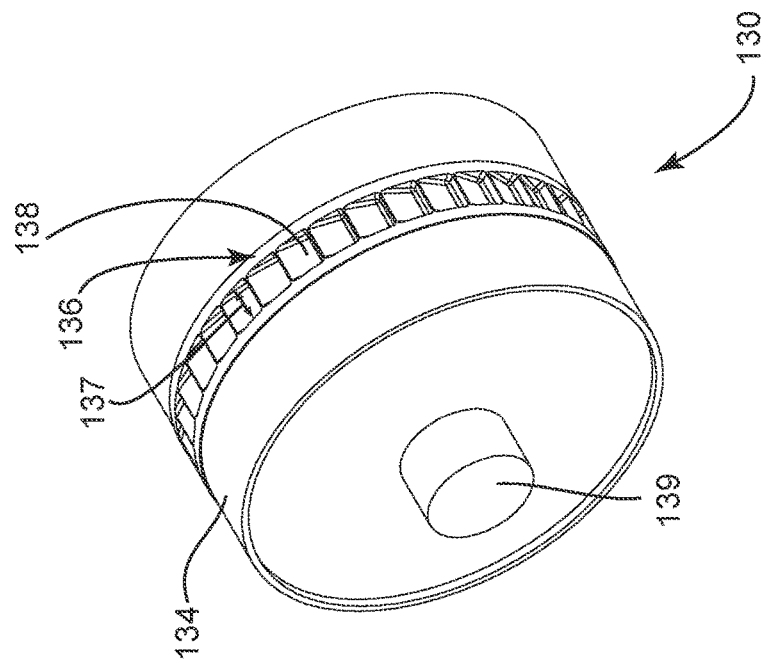
FIG. 3B is a perspective exploded view of a hydraulic motor according to an embodiment.
Figure 3B:
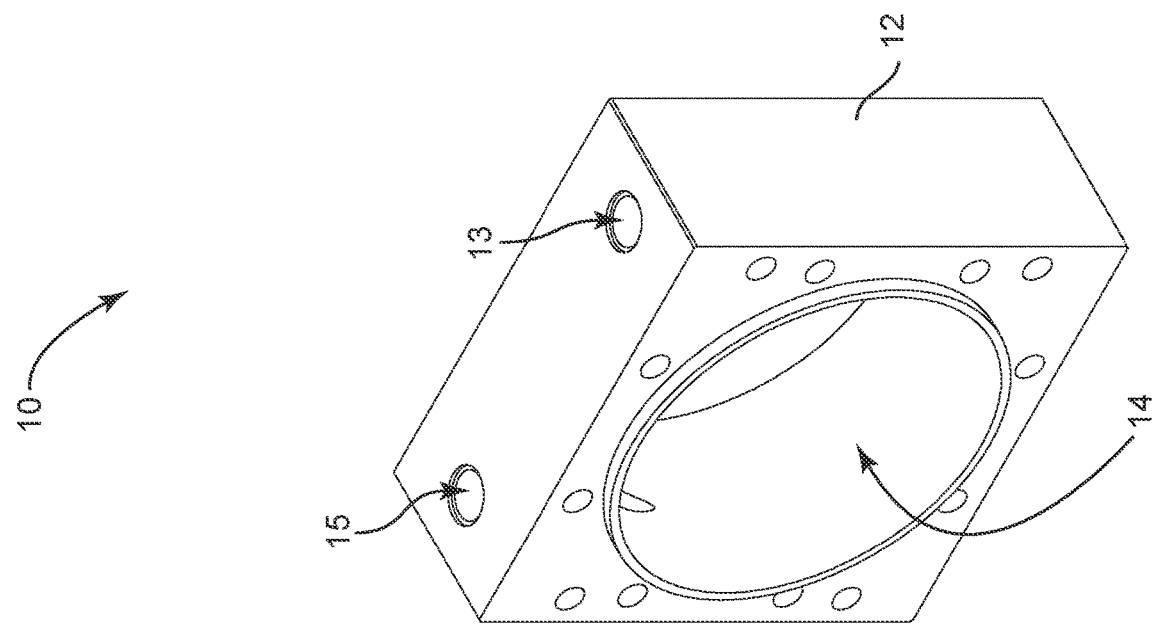
Figure 7B:
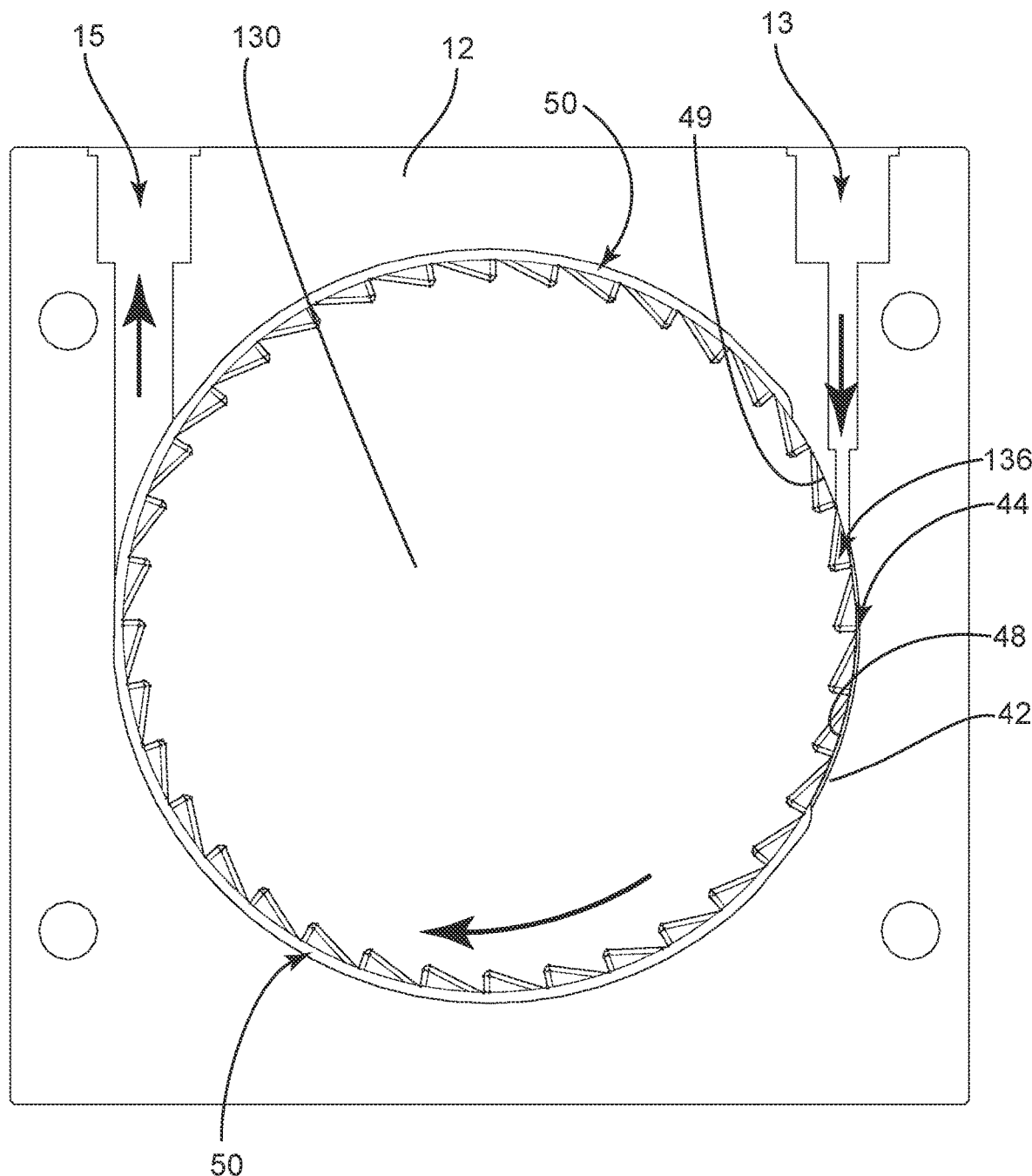
FIG. 7B is a section view of a manifold for use with a hydraulic motor according to an embodiment.

In another embodiment, shown in FIGS. 3B and 7B the vibration generating member 30 is replaced with a power generating member 130, formed as a spool, that comprises a solid shaft 134 and operates as a motor and can be coupled to an external device to supply power. The power generating member 130, formed as a spool, comprises a grooved drive 136 formed in the outer surface of the shaft 134 around a circumference of the shaft 134. The grooved drive 136 comprises a plurality of grooves 138 formed in the outer surface of the shaft 134 and are evenly spaced around the circumference of the shaft 134, such that hydraulic fluid may engage the grooves 138 to rotate the shaft 134 to generate power, such as through a drive shaft to supply power operate an external device. The operation of the manifold 12 with the pressure chamber 40 is the same in a hydraulic motor as it is with vibration generating device wherein the power generating member 130 is the same as the vibration generating member 30 without the off center weight. This means method of operating a hydraulic motor with the manifold 12 is the same as the method of operating a hydraulic vibration generation device 30 with the manifold 12.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A method of operation of a hydraulic motor, the method comprising:
   providing a manifold comprising a fluid inlet orifice, a fluid outlet orifice, an inner volume defined by a cylindrical surface with a diameter, and a pressure chamber within the inner volume, the pressure chamber comprising:
      a protrusion extending from the cylindrical surface with the fluid inlet orifice extends through the protrusion into the inner volume;
      a pressure channel formed in the protrusion, the pressure channel overlapping the fluid inlet orifice and extends along a length of the protrusion below the fluid inlet orifice; and
      a seal portion formed above the fluid inlet orifice and on either side of the pressure channel, wherein the inner volume receives the power generating member within the inner volume locating the grooved drive adjacent the pressure channel such that flow of hydraulic oil is inhibited between the power generating member and the seal portion and directed through the pressure channel while engaging the grooved drive;
   providing a power generating member within the inner volume of the manifold, the power generating member is a shaft having a diameter that is smaller than the diameter of the cylindrical surface of the manifold forming a gap between the cylindrical surface and the power generating member, wherein the power generating member further comprises:
      a grooved drive comprising a plurality of recessed grooves formed in an outer surface of the power generating member, wherein the recessed grooves of the plurality of recessed grooves are evenly spaced around the circumference of the power generating member;
   flowing hydraulic oil into the manifold through the fluid inlet orifice and into the pressure chamber;
   directing the hydraulic oil through the pressure chamber to engage the power generating member to rotate the power generating member to generate power; and
   flowing hydraulic oil from the pressure chamber and out of the manifold through the fluid outlet orifice.

2. The method of claim 1, wherein directing the hydraulic oil through the pressure chamber to engage the power generating member to rotate the power generating member to generate power comprises flowing hydraulic oil through the fluid inlet orifice and into the pressure channel, through the pressure channel engaging the grooved drive to rotate the power generating member, and out of the pressure channel where pressure is relieved as the hydraulic oil flows into the gap.

3. The method of claim 2, wherein the protrusion of the pressure chamber comprises any length between the fluid inlet orifice and the fluid outlet orifice.

4. The method of claim 3, wherein the pressure channel comprises a width.

5. The method of claim 4, wherein a width of the plurality of recessed grooves of the grooved drive is equal to or smaller than the width of the pressure channel.

* * * * *